(12) United States Patent
Lee

(10) Patent No.: US 6,704,227 B2
(45) Date of Patent: Mar. 9, 2004

(54) EMBEDDED MEMORY AND METHOD OF ARRANGING FUSES THEREOF

(75) Inventor: Joong-Eon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/051,824

(22) Filed: Jan. 17, 2002

(65) Prior Publication Data

US 2002/0126549 A1 Sep. 12, 2002

(30) Foreign Application Priority Data

Mar. 9, 2001 (KR) ........................................ 2001-12335

(51) Int. Cl.⁷ ................................................. G11C 7/00
(52) U.S. Cl. ..................................... 365/200; 365/225.7
(58) Field of Search ............................... 365/200, 225.7

(56) References Cited

U.S. PATENT DOCUMENTS

| | | | | |
|---|---|---|---|---|
| 6,363,020 B1 | * | 3/2002 | Shubat et al. | 365/200 |
| 6,486,526 B1 | * | 11/2002 | Narayan et al. | 257/529 |
| 6,505,324 B1 | * | 1/2003 | Cowan et al. | 714/736 |

* cited by examiner

*Primary Examiner*—Huan Hoang
(74) *Attorney, Agent, or Firm*—Mills & Onello LLP

(57) ABSTRACT

An embedded memory includes a memory cell array, a predetermined number of first function circuits for controlling input and output of data of the memory cell array, and at least one second function circuit having a predetermined number of fuses, wherein the predetermined number of fuses are arranged separately from each other in at least one of the predetermined number of first function circuits.

17 Claims, 8 Drawing Sheets

US 6,704,227 B2

EMBEDDED MEMORY AND METHOD OF ARRANGING FUSES THEREOF

CROSS REFERENCE

This application claims the benefit of Korean Patent Application No. 2001-12335, filed on Mar. 9, 2001, under 35 U.S.C. §119, the entirety of which is hereby incorporated by reference.

BACKGROUND OF THE INVENTION

1. Field of the Invention

The present invention relates to a memory device, and more particularly, to an embedded memory and a method of arranging fuses thereof.

2. Description of Related Art

Typically, compiled memories have memory cell arrays of small capacity. Such a compiled memory is packaged along with other logic and functional blocks. The compiled memory is connected to other logic, and function blocks perform a specific function.

An integrated circuit (IC) containing the compiled memory, the other logic and the function blocks is referred to as an application specific integrated circuit (ASIC). The embedded memory is one in which the compiled memory is embedded in the ASIC.

The compiled memory is designed by programming a memory having a memory cell array of a specific capacity. Due to its small capacity, the compiled memory does not include a redundancy circuit and thus is not repaired even though a defect occurs.

However, as the functions of the ASIC become diverse and thus data to be process increases, the compiled memory of large capacity becomes increasingly required. Hence, the compiled memory of relative large capacity requires a redundancy circuit.

A redundancy circuit for use in the compiled memory is configured in such a way that fuses are arranged gathered at one position in order to form a fuse box. However, the compiled memory having the redundancy circuit in the form of a fuse box is inefficient in layout, and suffers from delayed signal transmission because signal lines that lie over the compiled memory should not overlap over the fuse box and thus are more lengthy than they would otherwise need to be.

SUMMARY OF THE INVENTION

To overcome the problems described above, preferred present invention provides an embedded memory and a method of arranging fuses thereof that can provide an efficient layout and improved signal transmission.

The present invention is directed to an embedded memory. In a first aspect, the embedded memory includes a memory cell array, a predetermined number of first function circuits for controlling input and output of data of the memory cell array, and at least one second function circuit having a predetermined number of fuses, wherein the predetermined number of fuses are arranged separately from each other in at least one of the predetermined number of the first function circuits.

The present invention further provides a method of arranging fuses of an embedded memory having a memory cell array, a predetermined number of first function circuits for controlling input and output of data of the memory cell array, and at least one second function circuit having a predetermined number of fuses. The method includes arranging the predetermined number of fuses separately from each other in at least one of the predetermined number of first function circuits.

In another aspect, the invention is directed to a circuit with an embedded memory. The circuit includes signal lines lying over the embedded memory. A redundancy circuit has a plurality of fuse portions, each of the fuse portions being separately arranged between the two adjacent signal lines.

In another aspect, the invention is directed to an embedded memory. The memory includes a redundancy circuit having a plurality of fuse portions, the fuse portions being arranged independently from each other.

Since the embedded memory has the fuses arranged separately from each other, an efficient layout can be achieved, and a signal transmission rate can be improved.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
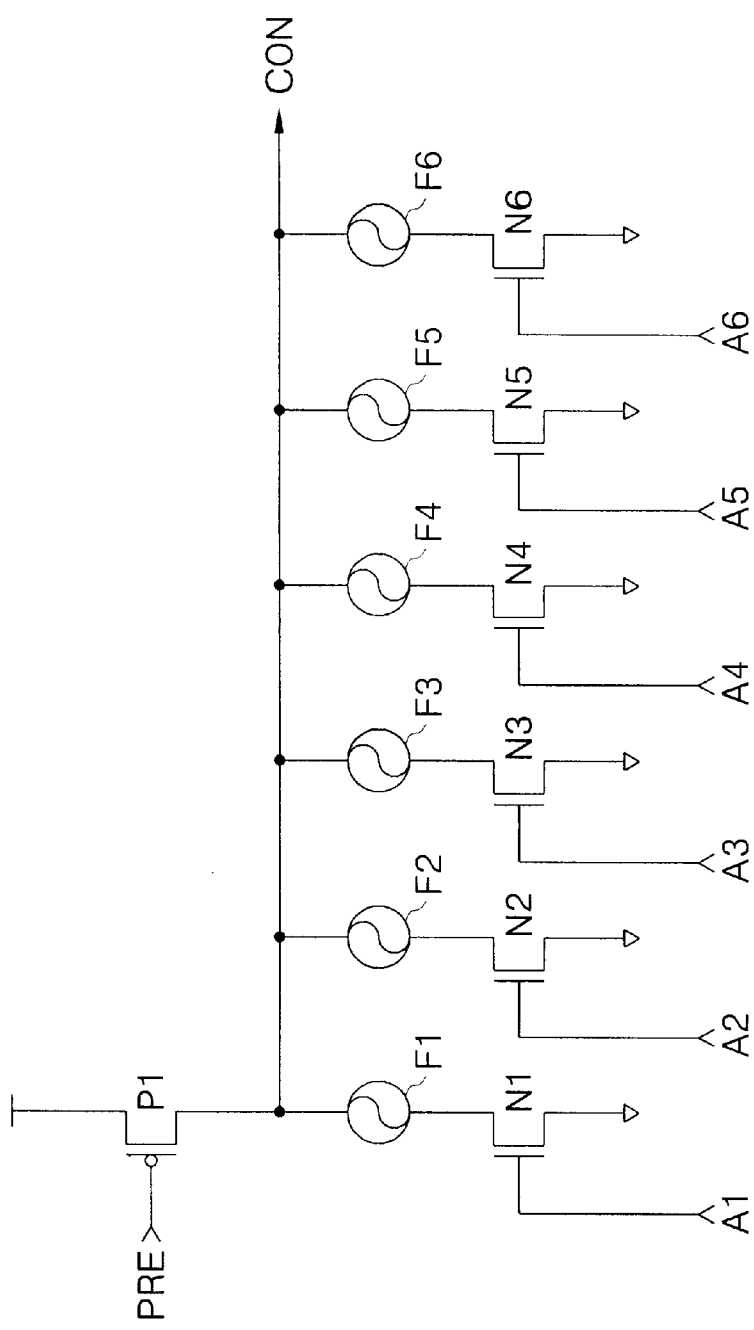
FIG. 1 is a circuit diagram illustrating a conventional memory redundancy circuit.

Referring to FIG. 1, there is shown a conventional memory redundancy circuit including a PMOS transistor P1, fuses F1 to F6, NMOS transistors N1 to N6.

Operation of the redundancy circuit of FIG. 1 is in accordance with the following. Assuming that addresses A1 to A6 are "100000". A repair operation is performed by blowing the fuse F1 and rendering the fuses F2 to F6 unblown.

When a pre-charge signal PRE having a logic "low" level is applied, the PMOS transistor P1 is turned on to generate a control signal CON having a logic "high" level.

When the pre-charge signal PRE has a logic "high" level and the addresses A1 to A6 of "100000" are applied, the PMOS transistor P1 is turned off, the NMOS transistor N1 is turned on, and the NMOS transistors N2 to N6 are turned off, whereupon the control signal CON remains logic "high".

When the addresses A1 to A6 of "111100" are applied, the PMOS transistor P1 is turned off, the NMOS transistors N1 to N4 are turned on, and the NMOS transistors N5 and N6 are turned off, whereupon the control signal CON having a logic "low" level is generated.

As described above, the defective memory cells corresponding to defective address are replaced with the redundant memory cells by programming of the defective address using the fuses F1 to F6.

Figure 2:
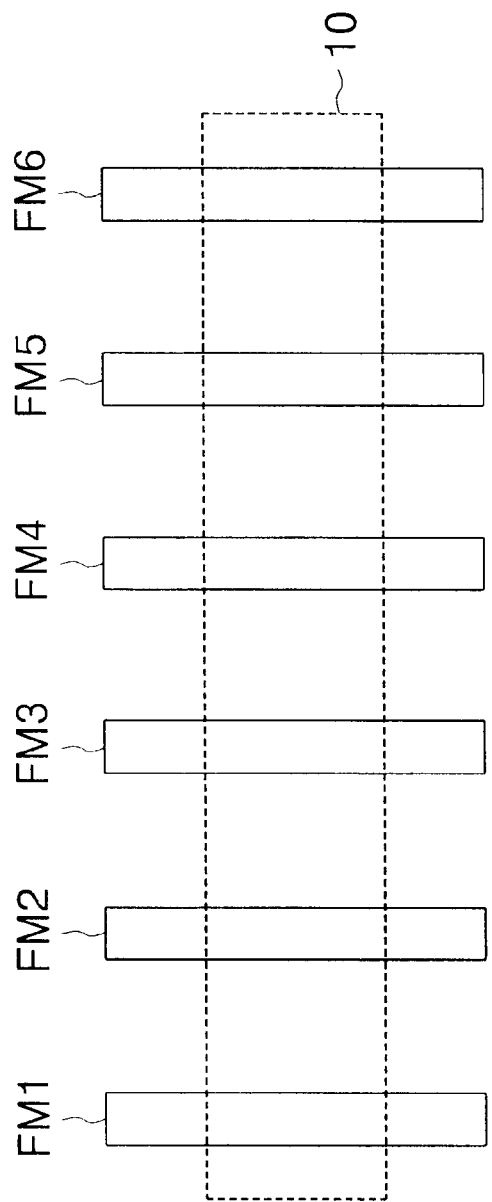
FIG. 2 is a layout view illustrating a layout of the conventional redundancy circuit of FIG. 1.

FIG. 2 is a layout view illustrating a layout of the conventional redundancy circuit of FIG. 1. Fuse metal lines FM1 to FM6 are arranged gathered at one position in order to form a fuse box having fuses F1 to F6. Reference numeral 10 denotes portions of the fuse metal lines FM1 to FM6, to form a fuse box, which have are sufficiently thin to be blown by a laser.

In the conventional redundancy circuit, the fuses F1 to F6 are arranged as the most upper layer. Signal lines are arranged not to overlap over the fuse box 10.

Figure 3:
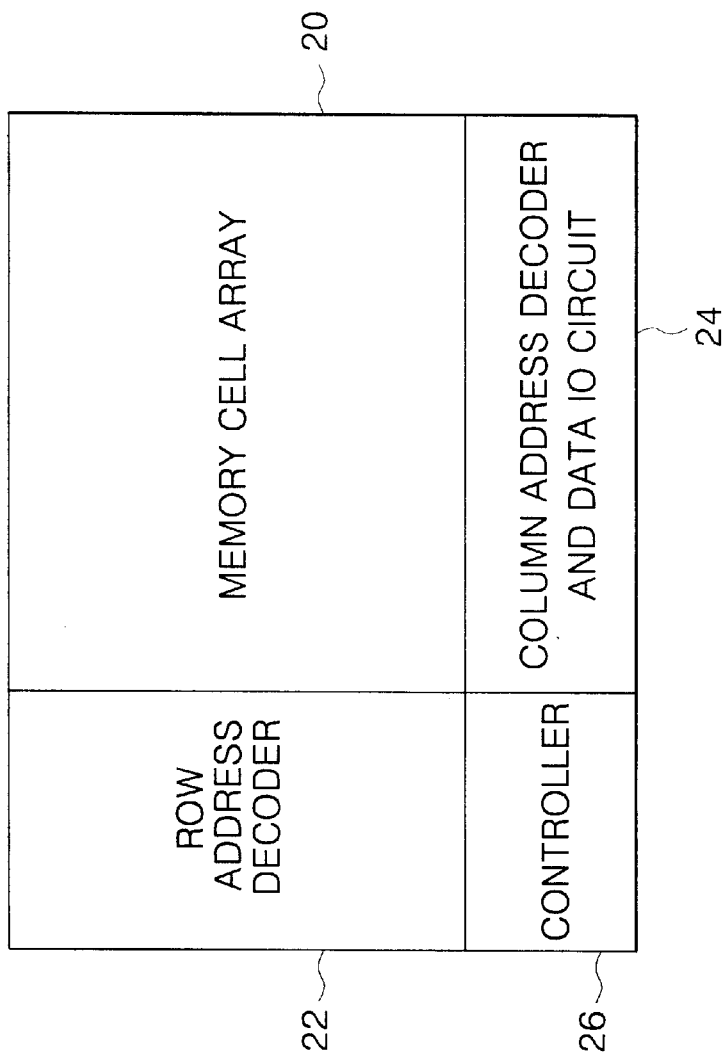
FIG. 3 is a block diagram illustrating a conventional compiled memory.

FIG. 3 is a block diagram illustrating a conventional compiled memory. The compiled memory includes a memory cell array 20, a row address decoder 22, a column address decoder and data IO circuit 24, and a controller 26.

The memory cell array 20 stores data and outputs stored data. The row address decoder 22 decodes a row address to select word lines (not shown) of the memory cell array 20. The column address decoder and data IO circuit 24 decodes a column address to select bit lines (not shown) of the memory cell array 20. The controller 26 controls the row address decoder 22 and the column address decoder and data IO circuit 24 in response to a command signal.

Figure 4:
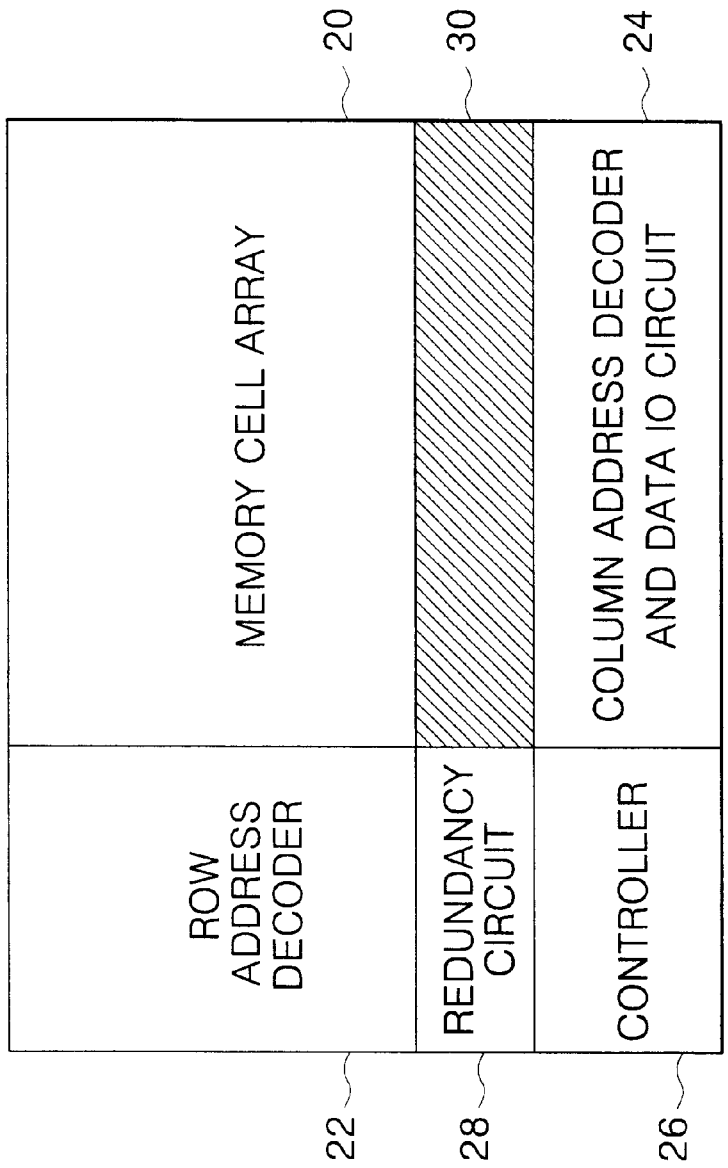
FIG. 4 is a block diagram illustrating a conventional compiled memory having the redundancy circuit.

FIG. 4 is a block diagram illustrating a conventional compiled memory having the redundancy circuit. FIG. 4 shows an arrangement of the redundancy circuit in the case in which the redundancy circuit cannot be arranged on regions corresponding to the row address decoder 22, the column address decoder and data IO circuit 24, or the controller 26.

The redundancy circuit 28 is arranged between the row address decoder 22 and the controller 26 and, therefore an unused region 30 exists, leading to inefficient layout.

Figure 5:
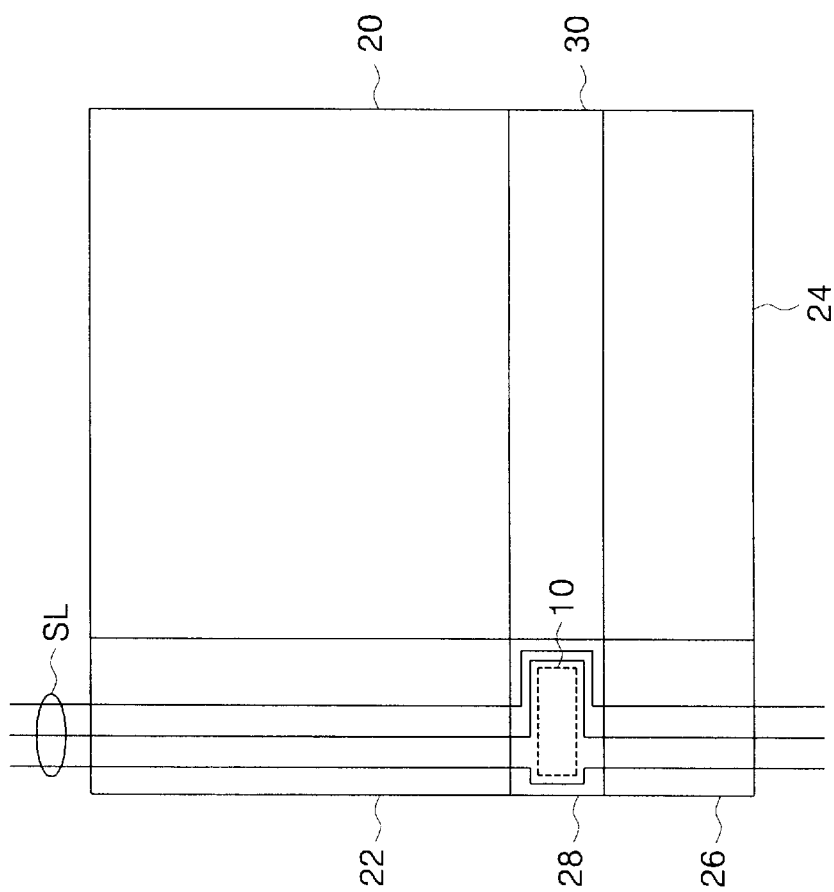
FIG. 5 is a plan view illustrating the compiled memory having the redundancy circuit of FIG. 4.

FIG. 5 is a plan view illustrating the compiled memory having the redundancy circuit of FIG. 4. A portion 10 defined by a dotted line is identical to the fuse box 10 of FIG. 2. A reference SL denotes signal lines that lie over the compiled memory. The signal lines SL should not overlap over the portion 10.

Therefore, there exist problems in that the signal lines SL become lengthy, thereby delaying a signal transmission speed.

Figure 6:
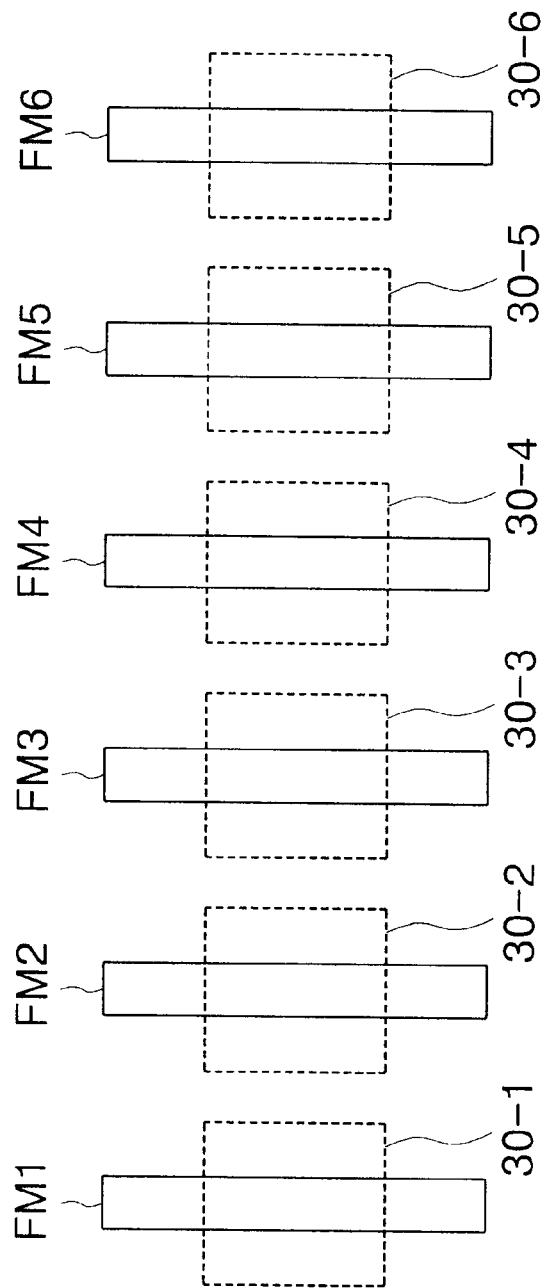
FIG. 6 is a layout view illustrating a layout of fuses arranged in a redundancy circuit according to an embodiment of the present invention.

FIG. 6 is a layout view illustrating a layout of fuses arranged in a redundancy circuit according to an embodiment of the present invention. As shown in FIG. 6, fuse metal lines FM1 to FM6 are not arranged gathered at one position but separately at different positions to respectively form the fuses F1 to F6 (see FIG. 1). Reference numerals 30-1 to 30-6 denote fuse portions of the fuse metal lines FM1 to FM6 which have sufficiently thin to be blown by a laser. Since the fuse metal lines FM1 to FM6 are separately arranged at different positions, the fuse portions 30-1 to 30-6 to be blown by a laser are arranged separately from each other.

Figure 7:
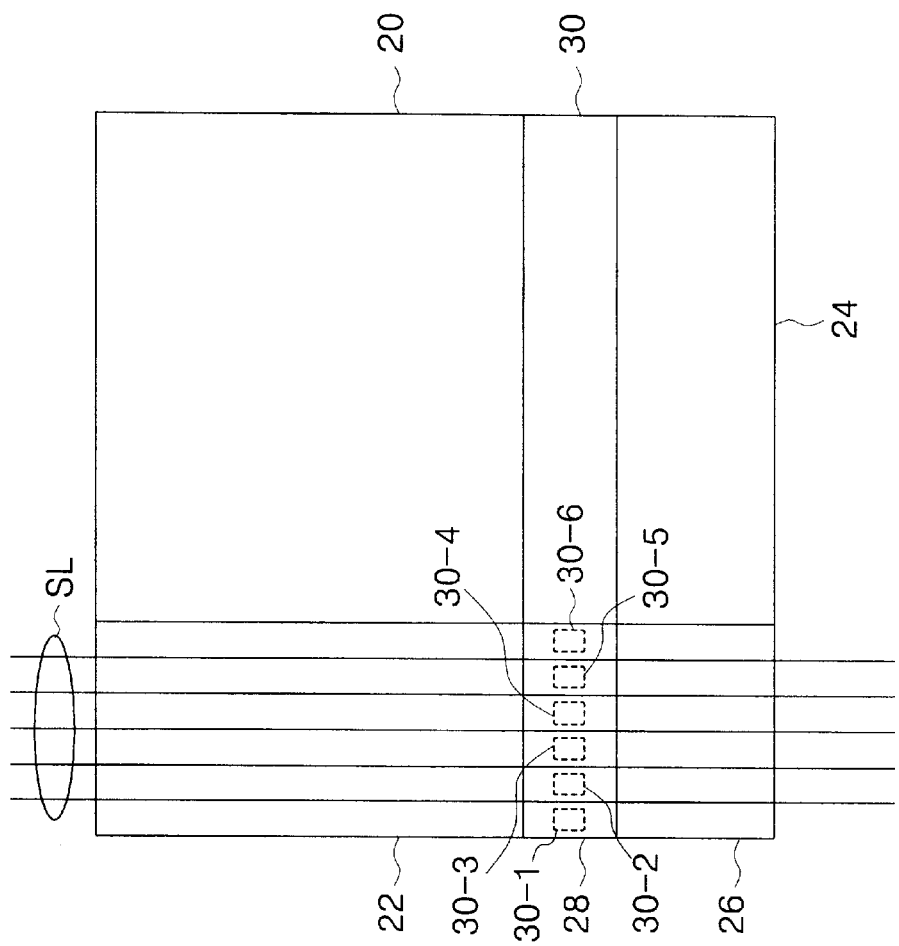
FIG. 7 is a plan view illustrating a compiled memory having a redundancy circuit according to the embodiment of the present invention shown in FIG. 6.

FIG. 7 is a plan view illustrating a compiled memory having a redundancy circuit according to the embodiment of the present invention. Like reference numerals of FIGS. 5 and 7 denote like components. In FIG. 7, the fuse portions 30-1 to 30-6 are defined by a dotted line. A reference SL denotes signal lines which lie over the compiled memory. The fuse portions 30-1 to 30-6 are respectively arranged between the two adjacent signal lines SL, and the signal lines SL of FIG. 7 are shorter in length than the signal lines SL of FIG. 5, thereby preventing a signal transmission speed from being delayed.

Figure 8:
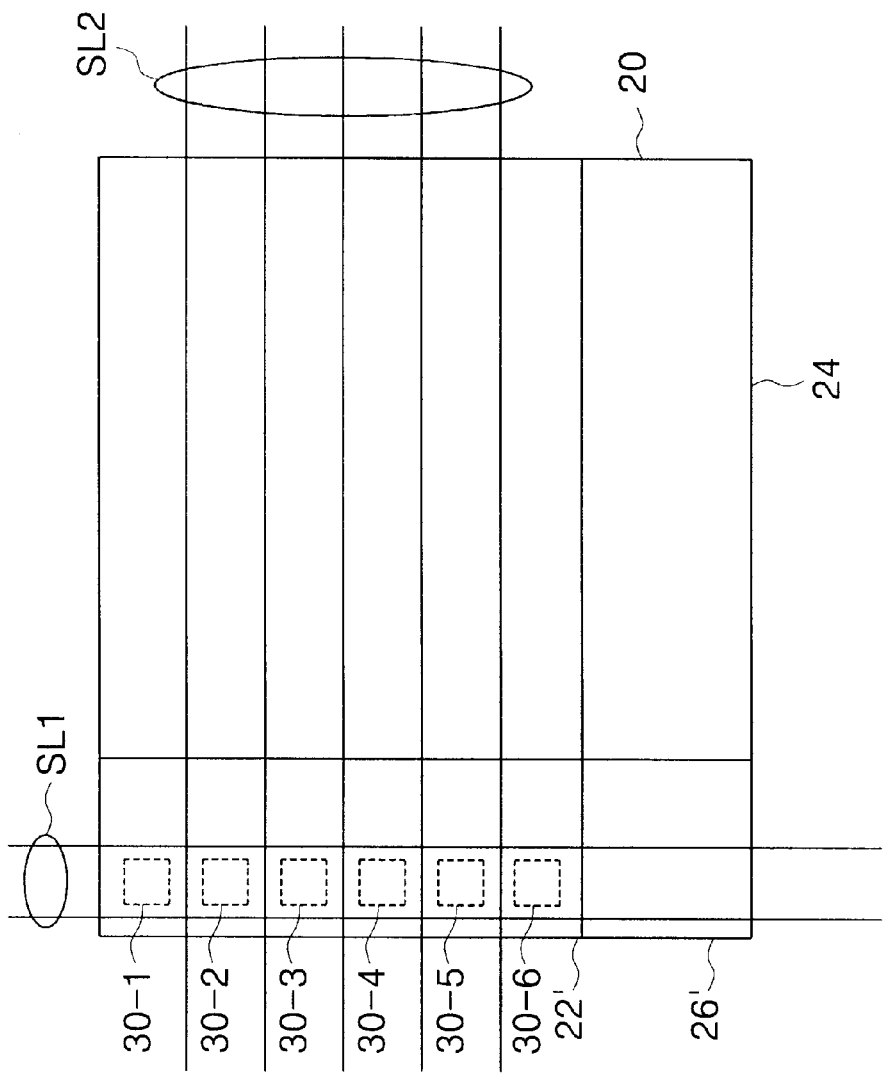
FIG. 8 is a plan view illustrating the compiled memory having the redundancy circuit according to another embodiment of the present invention.

FIG. 8 is a plan view illustrating the compiled memory having the redundancy circuit according to another embodiment of the present invention. The compiled memory of FIG. 8 overcomes inefficiency in layout of a compiled memory due to the unused region 30.

Preferably, a memory cell 20 and a column address decoder and data IO circuit 24 of FIG. 8 are equal in layout area size to those of FIG. 3, whereas a row address decoder 22 and a controller 26' are slightly larger in layout area size to those of FIG. 5 or 7 because they are configured by adding the fuse metal lines FM1 to FM6 to the row address decoder 22 of FIG. 3 portion.

The signal lines SL are arranged in a transverse direction, and the fuse metal lines FM1 to FM6 are arranged between the two adjacent signal lines SL separately in a transverse direction, thereby preventing signal transmission from being delayed and bringing about an efficient layout.

As described herein before, since the embedded memory has the fuses arranged separately from each other, an efficient layout can be achieved, and a signal transmission rate can be improved.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An embedded memory, comprising:
    a memory cell array;
    a plurality of signal lines for carrying data to and from the memory cell array;
    a predetermined number of first function circuits for controlling input and output of data of the memory cell array; and
    at least one second function circuit having a predetermined number of fuses, each fuse having an activation portion at which the fuse can be activated by making it nonconductive;
    wherein the predetermined number of the fuses are arranged separately from each other in at least one of the predetermined number of first function circuits, at least one of the signal lines being disposed between the activation portions of two adjacent fuses.

2. The memory of claim 1, wherein the embedded memory is a compiled memory.

3. The memory of claim 1, wherein laser blown portions of the predetermined number of fuses are separated from each other.

4. The memory of claim 1, wherein the memory cell array includes normal memory cells and redundant memory cells.

5. The memory of claim 4, wherein the second function circuit is a redundancy circuit to replace a defective memory cell with the redundant memory cell when the defective memory cell is found in the normal memory cells.

6. A method of arranging fuses of an embedded memory having a memory cell array, a plurality of signal lines for carrying data to and from the memory cell array, a predetermined number of first function circuits for controlling input and output of data of the memory cell array, and at least one second function circuit having a predetermined number of fuses, each fuse having an activation portion at which the fuse can be activated by making it nonconductive, the method comprising:

arranging the predetermined number of the fuses separately from each other in at least one of the predetermined number of first function circuits, such that at least one of the signal lines is disposed between the activation portions of two adjacent fuses.

7. The method of claim 6, wherein the embedded memory is a compiled memory.

8. The method of claim 6, wherein laser blown portions of the predetermined number of fuses are separated from each other.

9. A circuit with an embedded memory, comprising:

signal lines lying over the embedded memory; and a redundancy circuit having a plurality of fuse portions, each fuse portion having an activation portion at which the fuse portion can be activated by making it nonconductive, each of the fuse portions being separately arranged such that at least one of the signal lines is disposed between the activation portions of two adjacent fuses.

10. The circuit of claim 9, further comprising:

a memory cell array for storing and outputting data and having word lines and bit lines;

a row address decoder for decoding a row address to select the word lines of the memory cell array;

a column address decoder and data IO circuit for decoding a column address to select the bit lines of the memory cell array; and a controller for controlling the row address decoder and the column address decoder and data IO circuit in response to a command signal.

11. The circuit of claim 10, wherein the fuse portions are arranged on the row address decoder portion.

12. The circuit of claim 11, wherein the signal lines lie in a parallel direction to the row address decoder.

13. The circuit of claim 12, wherein the fuse portions are arranged in the same direction as the signal lines.

14. The circuit of claim 11, wherein the signal lines lie in a perpendicular direction to the row address decoder.

15. The circuit of claim 14, wherein the fuse portions are arranged in the same direction as the signal lines.

16. An embedded memory, comprising:

a plurality of signal lines for carrying data to and from the memory cell array;

a redundancy circuit having a plurality of fuse portions, each fuse portion having an activation portion at which the fuse portion can be activated by making it nonconductive, the fuse portions being arranged such that at least one of the signal lines is disposed between the activation portions of two adjacent fuses.

17. The memory of claim 16, wherein the fuse portions are arranged in the same direction as the signal lines.

* * * * *